US007039841B2

(12) United States Patent
Cullen et al.

(10) Patent No.: US 7,039,841 B2
(45) Date of Patent: May 2, 2006

(54) TESTER SYSTEM HAVING MULTIPLE INSTRUCTION MEMORIES

(75) Inventors: Jamie S. Cullen, Sunnyvale, CA (US); Kris Sakaitani, San Jose, CA (US)

(73) Assignee: Credence Systems Corporation, Milpitas, CA (US)

( * ) Notice: Subject to any disclaimer, the term of this patent is extended or adjusted under 35 U.S.C. 154(b) by 240 days.

(21) Appl. No.: 10/435,613

(22) Filed: May 8, 2003

(65) Prior Publication Data

US 2004/0059437 A1   Mar. 25, 2004

Related U.S. Application Data

(60) Provisional application No. 60/379,341, filed on May 8, 2002.

(51) Int. Cl.
*G01R 31/28* (2006.01)
*G01R 31/26* (2006.01)

(52) U.S. Cl. ...................................... 714/724; 324/765

(58) Field of Classification Search ................ 714/724, 714/718; 324/765, 754, 158.1
See application file for complete search history.

(56) References Cited

U.S. PATENT DOCUMENTS

| | | | |
|---|---|---|---|
| 5,657,486 A | 8/1997 | Czamara et al. | |
| 5,737,512 A | 4/1998 | Proudfoot et al. | |
| 6,286,120 B1 | 9/2001 | Reichert et al. | |
| 6,826,721 B1 * | 11/2004 | Williamson et al. | ........ 714/725 |

OTHER PUBLICATIONS

"Reducing Test Application Time in High-level Test Generation" by Ravi et al. International Test Conference Proceedings, 200 Publication Date: Oct. 3-5, 2000 pp.: 829-838 INSPEC Accession No.:6859172.*
International Search Report, International Application No.: PCT/US03/14726, Dec. 22, 2003, pp. 1-2.

* cited by examiner

*Primary Examiner*—Albert Decady
*Assistant Examiner*—Cynthia Britt
(74) *Attorney, Agent, or Firm*—Fish & Richardson P.C.

(57) ABSTRACT

An apparatus for testing an integrated circuit includes a sequence control logic unit having an output channel connectable to an input pin of a device under test, a first memory to store a first instruction set comprising instructions executable by the sequence control logic unit, and a second memory to store a second instruction set comprising instructions executable by the sequence control logic unit, wherein at least one of the first memory and the second memory comprises a memory accessible in a non-sequential fashion.

20 Claims, 2 Drawing Sheets

TESTER SYSTEM HAVING MULTIPLE INSTRUCTION MEMORIES

CLAIM OF PRIORITY

This application claims priority under 35 USC §119(e) to U.S. patent application Ser. No. 60/379,341, filed on May 8, 2002, the entire contents of which are hereby incorporated by reference.

BACKGROUND

This application relates to integrated circuit testing.

In a typical integrated circuit testing system a sequence of test patterns (a "test sequence") is applied to the pins of a device under test (DUT). Many different types of test patterns may be used to test different logic sections contained with a particular DUT, for example, Scan patterns, Functional patterns, Algorithmic patterns and Analog patterns. Some types of test patterns are applied to a DUT pin in a serial fashion (e.g., scan patterns) and others are applied to a set of pins in parallel (e.g., functional patterns, analog patterns and algorithmic patterns). Depending on the architecture of the DUT, a test sequence may include outputting a combined test pattern, i.e., outputting more than one type of test pattern at the same time to different pins of a DUT.

During a test sequence a DUT may output test "results" from an output pin. Therefore, a testing system may include one or more input channels connected to a DUT to receive test results during a test sequence.

SUMMARY

According to an aspect of the invention, an apparatus for testing an integrated circuit includes a sequence control logic unit having an output channel connectable to an input pin of a device under test, a first memory to store a first instruction set including instructions executable by the sequence control logic unit; and a second memory to store a second instruction set comprising instructions executable by the sequence control logic unit, wherein at least one of the first memory and the second memory includes a memory accessible in a non-sequential fashion.

One or more of the following features may be included: An apparatus for testing an integrated circuit wherein at least one of the first memory and the second memory includes a memory to store a data set, the data set being used by the sequence control logic unit to determine a test pattern to output on the output channel. An apparatus for testing an integrated circuit wherein, during operation of the apparatus, execution of a first instruction from the first instruction set of instructions causes a second instruction to be executed from the second instruction set of instructions. An apparatus for testing an integrated circuit wherein the first memory comprises a memory having a first width and the second memory comprises a memory having a second width that is not equal to the first width. An apparatus for testing an integrated circuit wherein instructions stored in the first memory comprise instructions having a first length and instructions stored in the second memory comprise instructions having a second length that is not equal to the first length. An apparatus for testing an integrated circuit wherein the sequence control logic unit includes a memory interface having a read/write memory access queue coupled to receive memory access requests from at least two separate requesters. An apparatus for testing an integrated circuit wherein the sequence control logic unit further comprises an instruction cache coupled to receive and to hold executable instructions from the memory interface. An apparatus for testing an integrated circuit wherein at least one of the first memory and the second memory comprises a memory to store test results received from the device under test. An apparatus for testing an integrated circuit wherein the apparatus may include a front end processor coupled to load at least one of the first instruction set, the second instruction set, and the data set to the memory interface. An apparatus for testing an integrated circuit wherein the sequence control logic unit may include a plurality of pattern control logic blocks, at least one of the pattern control logic blocks comprising logic to output a test pattern based on data received from the data set. An apparatus for testing an integrated circuit wherein the apparatus may include a plurality of selection multiplexors to receive at least one output bit from a corresponding one of the plurality of pattern control logic blocks, and a data selection logic block to control an output of each of the plurality of selection multiplexors. An apparatus for testing an integrated circuit wherein the data selection logic block determines the data selection codes for each of the plurality of selection multiplexors based on a portion of an executable instruction stored in a one of the first memory and the second memory. An apparatus for testing an integrated circuit wherein the data set stored in the first memory and the second memory comprises at least one of a data set representing functional data, scan data, and digitized analog data.

Embodiments of the invention may have one or more of the following advantages. For example, the apparatus may fetch instructions included in a combined test program in a linear fashion, a random-access fashion, or a combination. The capability to fetch instructions in a random-access fashion allows flexibility in the programming of the apparatus, e.g., instructions in an instruction set for the apparatus that may cause the execution of a non-linear test sequence program. Furthermore, in some implementations, the apparatus includes two memories, each of which may be used to store instruction sets and/or data sets which may reduce the cost of the apparatus because additional memories are not required for each set of instructions, or for each different type of test pattern required for testing a specific DUT. Also, the reliability of the apparatus may be increased because the number of separate components is reduced, e.g., the number of memories and separate logic blocks may be reduced.

DESCRIPTION

Figure 1:
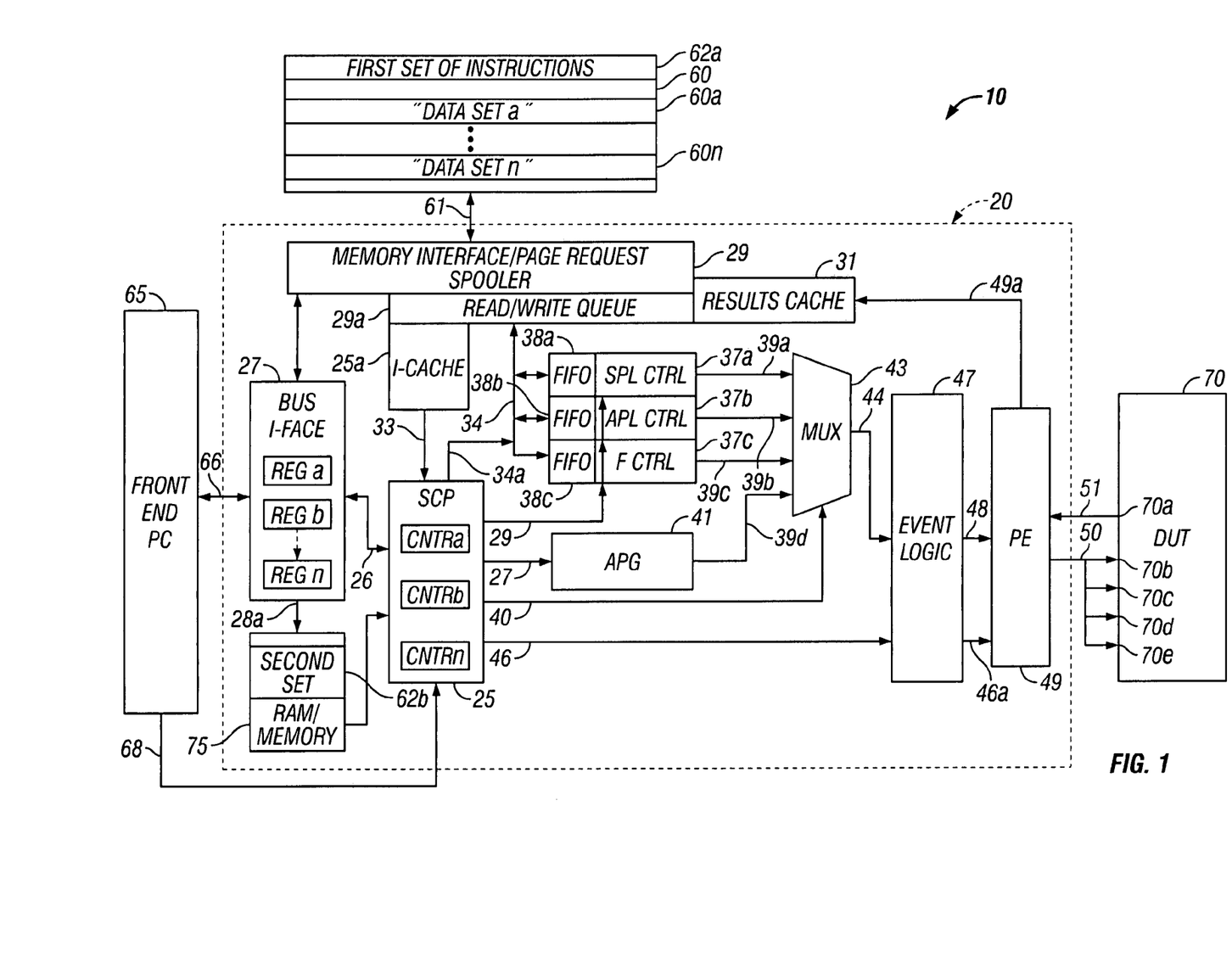
FIG. 1 is a block diagram showing a first embodiment of an integrated circuit testing system.

Referring to FIG. 1, an integrated circuit testing system 10 for testing a device under test (DUT 70) includes a block of sequence control logic 20 (SCL 20), a first memory 60 and a front end processor 65 (FEP 65). SCL 20 includes a sequence control processor block 25 (SCP 25), a second memory 75, an output channel 50 and an input channel 51. SCP 25 may execute instructions stored in first memory 60 and/or second memory 75 and cause the output of test patterns to the DUT 70 from the output channel 50. In this example of system 10, a combined test sequence program 62 (not shown) includes a first instruction set of executable instructions 62a ("first instruction set 62a") and a second instruction set of executable instructions 62b ("second instruction set 62b"), both first instruction set 62a and second instruction set 62b being executable by SCP 25. During operation of system 10, first instruction set 62a is stored in first memory 60, and second instruction set 62b is stored in second memory 75. The combined test sequence program 62 is then executed by SCP 25 by alternately executing instructions from first instruction set 62a and from second instruction set 62b. During execution of combined test program 62, SCP 25 controls various logic blocks included in SCL 20 and generates test patterns that are output from output channel-50 to DUT 70.

In one implementation of system 10, executable instructions stored in memory 60 are accessed (e.g., read) by SCL 20 in a sequential fashion only ("linear-access") while executable instructions stored in memory 75 are accessed by SCP 25 in either a linear or random fashion. In this implementation, memory 60 may be implemented as a relatively large and relatively slow linear-access memory while memory 75 may be implemented as a relatively small and relatively fast random-access memory (i.e., memory 75 hereafter is referred to as "RAM 75").

A typical DUT requires the input of a sequential set of test patterns where the amount of time between each of the patterns may be determined by the speed of the DUT logic. Therefore, sequential test patterns output from SCL 20 to a DUT must be output in a timely fashion, e.g., to satisfy the input pattern timing requirements of the DUT. In one implementation of system 10 a relatively slow memory 60 is used to store part of the executable instructions included in a test sequence program. The time required to process a non-sequential access to a location in memory 60 may cause an unacceptably long delay between sequential test patterns output to DUT 70. Therefore, SCL logic unit 20 may be implemented to access memory 60 in a linear fashion only, e.g., reading instructions stored in sequential locations in memory 60 during execution of a combined test program 62. Conversely, a relatively fast random-access memory 75 may be included in system 10 allowing SCL 20 to fetching instructions included in a combined test program in both a linear fashion (e.g., from memory 60) and in a random-access fashion (e.g., from RAM 75). This way of fetching instructions in both a linear fashion and a random-access fashion allows flexibility in the programming of system 10, e.g., including instructions in a non-linear test sequence program (e.g., including a "jump address" instruction in the instruction set). Also, the relatively fast access time of RAM 75 allows SCP 25 to perform random-accesses of executable instructions stored on RAM 75 without causing an unacceptable delay between sequential test patterns output to DUT 70.

Conventional testing systems often include separate blocks of logic for the generation of each specific test pattern required for testing a DUT. Typically, each separate pattern-specific logic block included a separate memory for the storage of data sets and/or algorithmic information required to produce that specific type of test pattern. By contrast, system 10 includes a first memory 60 and a second memory 75 that are used to store instructions and may also be used to store data sets, where each data set potentially corresponds to a different type of test pattern that may be required to test a DUT. For example, the types of data sets may include Functional Data ("F-Data"), Scan data and Digitized-Analog data. However, any type of data that may be represented in a digital format may be stored and read from memory 60 and/or RAM 75. The use of memory 60 and RAM 75 to store both instructions and data sets reduces the cost of system 10 because separate memories are not required for each test sequence program and/or for each different type of test pattern required for a DUT. Furthermore, the use of memory 60 and RAM 75 to store both instructions and data sets may increase the reliability of system 10 because the number of separate components is reduced, i.e. the number of memories and separate logic blocks may be reduced.

Still referring to FIG. 1 SCP 25 executes combined test sequence program 62 and also controls the outputs of a series of pattern control logic blocks 37a–37c (PCLs 37a–37c) and an algorithmic pattern generator block 41 (APG 41). APG 41, when enabled by SCP 25, produces output bit patterns that are based on an algorithm that may be implemented in hardware or by a software program that is loaded into APG 41 before or during execution of program 62. The particular algorithm used depends on the type of testing desired and the specifics of the DUT. SPL control block 37a refers to a control block that determines appropriate SCAN bits to output based on a data set. APL control block 37b refers to a control block that determines appropriate digitized-analog bits to output based on a data set. F CTRL 37c refers to a control block that determines appropriate functional data bits to output based on a data set.

PCLs 37a–37c are connected to receive blocks of data from data sets 60a–60n stored in memory 60. Outputs 39a–39d of PCLs 37a–37c and APG 41 are input to a selector multiplexor 43 (MUX 43). A combined bit pattern is output from MUX 43 on bus 44, the combined bit pattern selected is controlled by a control line 40 from SCP 25. The combined bit pattern on bus 44 is then sent through an event logic block 47, and a pin electronics block 49. SCP 25 is connected to send a function signal to event logic 47 on control line 46. The function signal on line 46 is used by event logic 47 and pin electronics 49 to determine the appropriate output signal characteristics required by DUT 70. In more detail, functional signal 46 is used by event logic 47 and pin electronics 49 to determine the appropriate operational characteristics of the output signals sent to DUT 70, e.g., the timing, voltage level and/or current level required by each pin of DUT 70 connected to an output channel 50.

To access memory 60, SCL 20 includes a memory interface/page request spooler 29 (MIPRS 29) that is connected to memory 60 by memory bus 61. MIPRS 29 includes a read/write queue 29a that is connected to receive data and instruction read/write requests from various logic blocks ("requestors") within SCL 20. Read/write queue 29a allows MIPRS 29 to hold multiple read/write requests and then process those requests in turn. In this implementation of system 10, requestors include SCP 25 (which requests instructions from first instruction set 62a), PCLs 37a–37c (each of which may request data from data sets 60a–60n) and PE 49 (which may request data writes when results are received on input channel 51 from DUT 70). Each requester may also include an associated cache [or buffer] (e.g., a set of FIFO registers) to hold a buffer of data or instructions that is sufficient to allow a first requester to continue operation while MIPRS 29 is processing read or write requests from a second requester. For example, SCL 20 includes an instruction cache 25a and a results cache 31 both connected to MIPRS 29, which are used to store instructions read from memory 60 and-results data to be written to memory 60, respectively. Similarly, each PCL 37a–37c includes FIFO registers 38a–38c that are used to hold test data read from memory 60 and received from MIPRS 29 on bus 34, or read from RAM 75 and received on bus 34a from SCP 25.

SCL 20 also includes a bus interface block 27 that is connected to MIPRS 29 by bus 28 and RAM 75 by bus 28a. Bus interface block 27 is also connected to front end processor 65 by bus 66 and sequence control processor 25 (SCP 25) by bus 26. During operation of system 10, front end processor 65 loads a first instruction set of instructions 62a and/or test data sets 60a–60n into memory 60 by transmitting the instructions and data sets through bus-interface 27, bus 28 and MIPRS 29. Similarly, front end processor 65 loads a second instruction set of instructions 62b and/or test data sets into RAM 75 by transmitting the instructions and data sets to RAM 75 through bus-interface 27 and bus 28a.

Bus interface 27 includes several registers, REGa–REGn, that are used by front end processor 65 (FEP 65) to store the starting address of first instruction set 62a and the starting ("base") address for each data set stored in memory 60 and/or RAM 75. The base address and size of first instruction set 62a and each data set 60a–60n may vary. During operation of system 10, before loading, FEP 65 writes the base address for first instruction set 62a and each data set into one of the registers, REGa–REGn. The base addresses are forwarded to MIPRS 29, which uses the base addresses to determine the location of subsequent writes of first instruction set 62a and writes of each data set 60a–60n during the loading of memory 60. MIPRS 29 also uses the base addresses for first-instruction set 62a and each data set to determine the location of subsequent reads received from SCP 25 and pattern control blocks 37a–37c, respectively, i.e., determining subsequent read addresses within first instruction set 62a and each data set relative to the base addresses.

FEP 65 is connected to send command signals to SCP 25 by signal line 68. After first instruction set of instructions 62a and test data sets 60a–60n are loaded into memory 60, and second instruction set of instructions 62b are loaded into RAM 75, FEP 65 sends a "START" signal to SCP 25 on signal line 68, which causes SCP 25 to begin execution of test sequence program 62. When SCP 25 receives the 'START' signal from FEP 65, SCP 25 sends the starting address of first instruction set 62a (stored in one of the registers, REGa–REGn) to MIPRS 29. MIPRS 29 reads a block of instructions from first instruction set 62a beginning at the starting address sent and then forwards the executable instructions read to instruction cache 25a, which in turn forwards those instructions to SCP 25 on instruction bus 33.

As described previously, registers REGa–REGn are used to store the base addresses for first instruction set 62a and for each set of test data 60a–60n stored in memory 60. Once SCP 25 begins execution of test sequence program 62, SCP 25 reads and forwards those base addresses to MIPRS 29 through bus interface 27 to initiate a first read request for each required data set. Subsequent read requests are sent to MIPRS 29 from a requesting PCL 37a–37c that requires additional data from a data set 60a–60n. Similarly, SCP 25 sends an instruction read request to MIPRS 29 when additional instructions from first instruction set 62a are required by SCP 25. Each read request received by MIPRS 29 causes MIPRS 29 to read a page of instructions or data from the first instruction set 62a or test data set 60a–60n, respectively, and return a page of instructions or data, respectively, to the requester. "Page" refers to a block size of instructions or data that each requestor is able to store in its associated buffer. Each requestor may have a different page size.

SCP 25 is connected by control line 29 to control the advancement of data held in each FIFO 38a–38c to the outputs 39a–39c of each control blocks 37a–37c, respectively. SCP 25 also is connected by control line 27 to APG 41, to control the output 39d of algorithmic patterns to MUX 43. SCP 25 also is connected by selection line 40 to MUX 43 to control the selection of combined bit patterns on bus 44. During operation of system 10, as each executable instruction in test sequence program 62 is received by SCP 25, the instruction is decoded by SCP 25. Based on the executable instruction SCP 25 determines the output bits required from each PCL 37a–37c and APG 41, and outputs a selection code on control bus 40 to MUX 43. The selection code corresponds to the test pattern specified for each pin of DUT 70 and causes the selection of the appropriate bits from each of the pattern control blocks 37a–37c and-APG 41. As an example, if MUX 43 output bus 44 is 32 bits wide (and having bit positions of bit-0 through bit-31), an instruction may specify bit-0 as a scan bit from SPL control block 37a and bit1–bit31 as analog bits from APL control block 37b. In this case, SCP 25 sends a selection code to select the bits output from SPL block 37a and APL block 37b to form a combined output pattern from MUX 43, in this case, combining bit-0 from SPL block 37a and bit1–bit31 from APL block 37b. Following the output of the selection code to MUX 43, SCP 25 advances the appropriate bits from each of PCLs 37a–37c and APG 41 to the outputs 39a–39c, by sending an advance signal on control line 29 and control line 27, respectively. Therefore, in this example, an advance signal on bus 29 is sent to output 1 bit from SPL block 37a and 31 bits from APL block 37b.

The combined bit pattern output on bus 44 is input to event logic block 45. Event logic 45 also receives functional control signals on line 46 from SCP 25. The functional signal reflects the operational characteristics of the output signal required for each pin of DUT 70 connected to output channel 50. Event logic 47 forwards a digital signal pattern on bus 48 and a conditioning signal on bus 46a to pin electronics 49 (PE 49). The digital signal pattern on bus 48 is based on the required timing of DUT 70. PE 49 then "conditions" the received digital signal pattern according to the conditioning signal-on bus 46a, e.g., amplifying the voltage of the output signal, and/or converting the digital signal pattern into an analog output signal and/or adjusting the timing of an output signal required by a pin, or set of pins, of DUT 70.

The conditioned output signals from PE 49 to DUT 70 are output on signal channel 50, which is connected to DUT pins 70a–70d. As test patterns are output to DUT 70, test results may be input to SCL 20 from DUT 70 pin 70a connected to input channel 51. The received results are then sent over bus 49a and stored in results cache 31. When results cache 31 has stored a full page of results, results cache 31 sends a write request to MIPRS 29 to write the page of results to memory 60. The results stored in memory 60 may later be retrieved by front end processor 65 or SCP 25. In an embodiment of system 20, the results received are used by SCP 25 during execution of program 62 to determine the flow of instruction executed from program 62 (e.g., making a branch determination based on a received result).

In an embodiment, RAM 75 may be used to store test results and those results may be used to determine the flow of instruction execution.

In an embodiment, the instruction set used to program system 10 is a unified instruction set, i.e., a single set of instructions from which executable instructions are assembled for first instruction set of instructions 62a and second instruction set of instructions 62b. The use of a single unified instruction set reduces the complexity of programming system 10 since separate instruction sets are not required for both memory 60 and RAM 75.

Each instruction in the unified instruction set, when assembled into an executable instruction, includes an opcode field and an operand field. In an embodiment, the opcode field is four-bits in length. A four-bit opcode is a relatively short opcode, however, a relatively short opcode field allows the use of a relatively narrower memory width of memories 60 and/or RAM 75 in order to store executable instructions. Also, the relatively short opcode field length of four (4) bits allows a relatively larger operand field length that may be used to specify a relatively larger address or data value.

SCP 25 includes a set of counters, CNTRa–CNTRn, that are used to store count values specified by an instruction. A count value stored in one of the counters by a first instruction may be used by SCP 25 to determine the number of subsequent test patterns to output to DUT 70 during execution of subsequent instructions, as will be explained.

In an embodiment, the unified instruction set includes "selection" instructions that, when executed, cause the selection and/or setting of various hardware blocks included in system 10. For example, the unified instruction may include a "SDS data" (select data) instruction that is used to select the combined output pattern from the PCLs 37*a*–37*c*. As another example, the unified instruction set may include a "SLC x" (select counter) instruction that is used to select one of the counters, CNTRa–CNTRn, for the loading of a count value. The count value is generally used to determine the number of subsequent test patterns to output using a previously selected combined output pattern. For example, a test sequence program that is executable by system 10 may include one or more selection instructions that cause the selection of a combination of outputs from the PCLs, and/or cause the selection of a counter to store a count value (e.g., to specify the number of selected patterns to output during subsequent execution of the test program).

Example 1 (shown below) is an example test sequence program that includes a "SDS scan" (select data) instruction to select the output patterns from the PCLs, in this case, causing the selection of only scan bits from SPL PCL 37*a*. Example 1 also includes a "SCL a" instruction to select one of the counters, in this case, selecting CNTR a. The "SCL a" instruction is followed by a 'LDC 4095' (load counter value) instruction that, when executed, causes the count value of '4095' to be loaded into CNTRa. Example 1 also includes a "BOZ address1" (branch on zero to address1), that, when executed, causes the decrementing of the count value (e.g., a value of 4095) stored in CNTRa and the output of the selected output pattern during each cycle of execution by SCP 25 until the count value stored in CNTRa is decremented to zero.

EXAMPLE 1

| | |
|---|---|
| SDS "scan" | Scan data source is selected for all output pins. |
| SLC a | Selects counter a (CNTRa) |
| LDC 4095 | Loads the count value of 4095 into CNTRa |
| BOZ "address1" | Branch on zero. When executed by system 10, causes the output of selected 'scan' patterns until count value of 4095, stored in CNTRa, is decremented to zero. |

The unified instruction set may also include other selection instructions for causing the setting or selection of other hardware blocks included in system 10. For example, the unified instruction set may include a selection instruction to specify a 'SYNC' event, i.e., a signal, or code, that is detectable by a hardware block and used to synchronize the operation of multiple sequence control logic units.

The instructions included in test sequence program 62 may be specified by a programmer, or a user may execute a test sequence generation program on front end processor 65, for example. The test sequence generation program allows the user to make DUT testing selections via an input/output device (e.g., a keyboard or mouse, not shown) connected to front-end processor 65. For example, the test sequence generation program may allow the user to select and specify the type of test pattern required for each pin of DUT 70 and the number of sequential patterns to output to DUT 70 during execution of the test sequence program. The user may also select and specify the expected results from a DUT output pin during a test sequence. The user may also specify the physical characteristics of DUT 70, for example, the clock speed and/or the operational voltage levels required by DUT 70. The test sequence program 62 may include instructions that reflect the physical characteristics of the DUT so that the test pattern signals output from SCL 20 and input to the DUT will be "conditioned" to match the operational signal requirements of the DUT, as will be explained.

An assembler program may be used to assemble executable instructions based on the instructions included in the test sequence program (as specified by a programmer or based on the user's selections during execution of the test sequence generation program). The executable instructions are included in first instruction set 62*a* and/or second instructions set 62*b*.

As an example of using both memory 60 and RAM 75 to execute a combined test sequence program 62, a first instruction set of instructions 62*a* are loaded into memory 60 and a second instruction set of instructions 62*b* are loaded into RAM 75. A starting address of the first instruction set of instructions 62*a* is loaded into a register, e.g., REGa, and a start signal is input to SCP 25 by FEP 65 on signal line 68. SCP 25 begins execution of test program 62 by fetching an instruction from first instruction set 62*a* (stored in memory 60) from the designated address stored in REGa. SCP 25 fetches and executes instructions from first instruction set 62*a* until an instruction is fetched that causes SCP 25 to begin fetching instructions from RAM 75. For example, the unified instruction set includes a subroutine call instruction, "CAL address1", that specifies a sub-routine that is stored at "address1" in the second instruction set 62*b* stored in RAM 75. In this case, when SCP 25 fetches and decodes the "CAL address1" instruction from first instruction set 62*a*, SCP 25 begins fetching subsequent instructions from the sub-routine stored as part of second instruction set 62*b* stored in RAM 75. SCP 25 continues execution of the instructions from RAM 75 until a "RET" (return) instruction is fetched from second instruction set 62*b*. The RET instruction causes a return to fetching instructions from the calling instruction, in this case, the instruction in first instruction set 62*a* that follows the CAL instruction.

The unified instruction set may include instructions which may only be executed from RAM 75. For example, the unified instruction set may include a 'JMP address1'. (jump to address1) instruction that specifies the address of another instruction stored in RAM 75. When SCP 25 fetches and executes a 'JMP address1' instruction from RAM 75, SCP 25 begins fetching instructions from address1. The 'JMP address' instruction is an example of an instruction that causes a non-linear access to RAM 75, therefore, 'JMP address' instructions are not used to access instructions stored in memory 60, which in some implementations is accessible in only a linear fashion.

The assembler program may also determine which instructions included in a test sequence program are to be included in first instruction set 62a and second instruction set 62b. For example, the assembler may determine which instructions may be fetched and executed in a linear fashion, and which instructions may be fetched and executed in a non-linear fashion.

In an implementation of system 10, RAM 75 is implemented with a larger width than memory 60. Therefore, executable instructions stored in RAM 75 may be longer and include opcode fields and/or operand fields that are longer than those stored in memory 60. For example, memory 60 may be thirty-two (32) bits wide and RAM 75 may be 40 bits wide. Therefore, an instruction in second instruction set 62b, and stored in RAM 75, may include an operand field that is longer than the operand field of an instruction in first instruction set 62a. The longer operand field included in a second instruction set instruction may be used to specify a data value or address that is greater than an instruction stored in first instruction set 62a. However, instructions in first instruction set 62a may use a count value stored by a previously executed instruction in second instruction set 62b, to cause an output of a sequence of test patterns that is longer than would otherwise be possible using the relatively short operand field of first instruction set 62a (memory 60) executable instructions. In more detail, an instruction included in second instruction set 62a, when executed, may cause the loading of a data value into a counter, e.g., CNTRa, followed by execution of an instruction in first instruction set 62a that uses the stored value in CNTRa. In this implementation, SCP 25 may include a logic block (not shown) that determines whether to decode operand field sizes that correspond to the operand field size of an instruction in RAM 75 or an instruction in memory 60.

Figure 2:
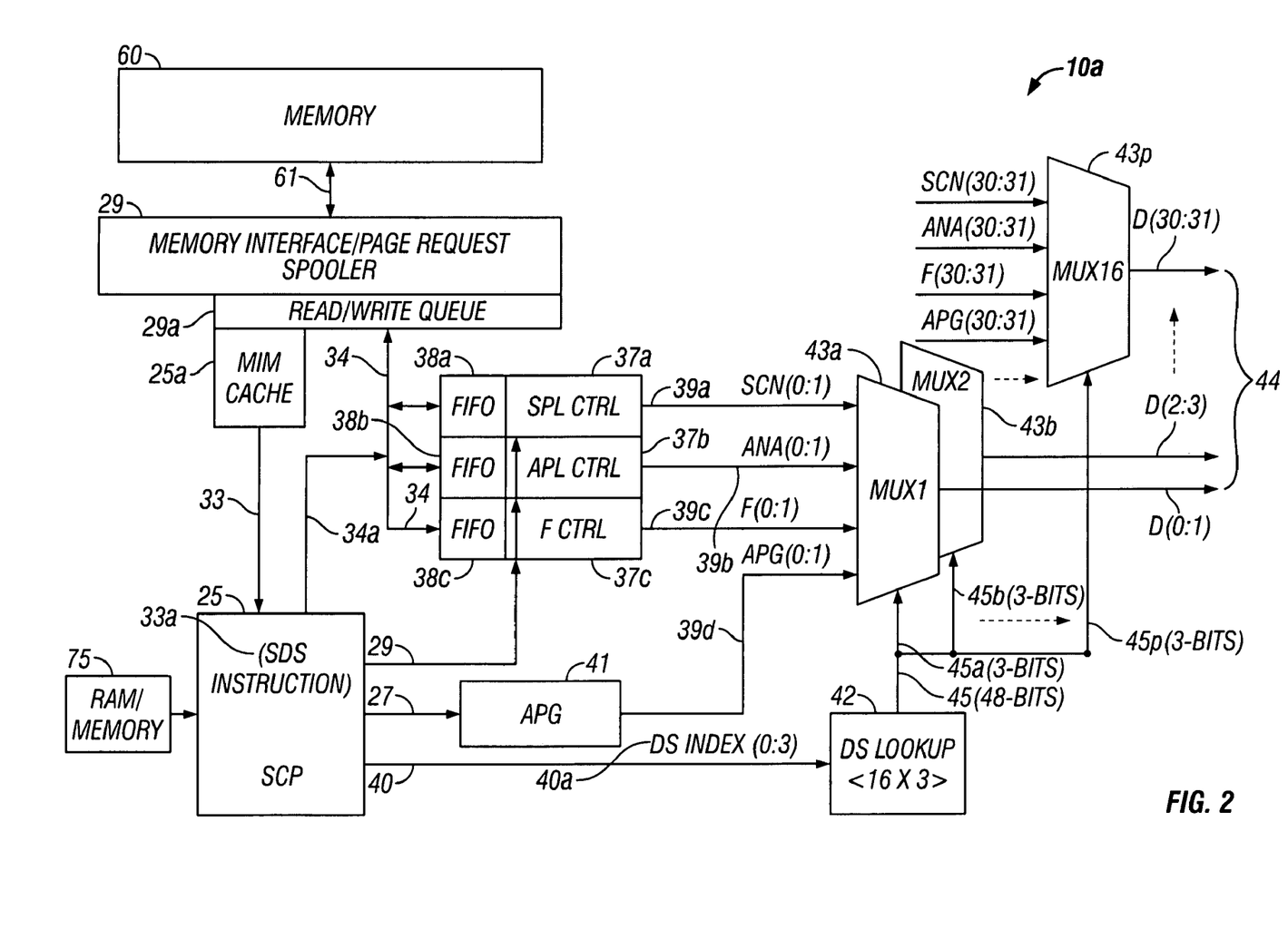
FIG. 2 is a block diagram showing a second embodiment of an integrated circuit testing system.

Referring to FIG. 2, an alternate embodiment of testing system 10 includes Data Selection Logic 10a (DSL 10a). DSL 10a depicts an alternative way of selecting and distributing a combined bit pattern from PCLs 37a–37c and APG 41. In some cases, the number of output lines from a set of pattern control logic blocks, such as PCL 37a–37c and APG 41, may exceed the input line capacity of a single multiplexor, such as MUX 43. Therefore, DSL 10a enables a relatively large number of inputs to be multiplexed using multiple multiplexors 43a–43f that are controlled by the outputs of a data selection lookup-logic block 42 (DSLLB 42). In more detail, each PCL 37a–37c and APG 41 outputs thirty-two (32) bits of data on buses 39a–39d, respectively. Sixteen (16) selection multiplexors 43a–43p, are connected to receive two. (2) bits, respectively, from each output bus 39a–39n of PCL 37a–37c and APG 41. Each MUX 43a–43p is then selected to output two (2) bits on sixteen (16) output buses D(0:1)–D(30:31), respectively, to form a combined bit pattern on bus 44. In order to select the appropriate combined bit pattern on bus 44, DSLLB 42 is loaded with an indexed lookup table prior to the execution of test sequence program 60a. DSLLB 42 is connected to receive a 4-bit data selection index 40a (DS Index 0:3) from SCP 25 on line 40, and then output a 3-bit selection code to each MUX 43a–43p on selection lines 43a–43p, respectively. Data selection index 40a corresponds to a portion of the operand field of an SDS instruction 33a fetched from either memory 60 or RAM 75 during operation of system 10. SCP 25 decodes the SDS instruction and outputs a corresponding four-bit data selection index 40a (DS Index (0:3)) to DSLLB 42. DSLLB 42 uses the received four-bit 'DS Index' to index into the stored lookup table and output sixteen (16) separate three-bit selection codes, each three-bit code on separate selection buses 45a–45p, to each MUX 43a–43p, respectively.

This way of controlling multiple multiplexors with an indexed lookup table allows an executable instruction having a relatively short opcode field to control a relatively large number of multiplexors. In this case, an SDS instruction is assembled and represented by the four-bit (4) opcode field and used-to select sixteen 3-bit selection codes that are output from DSLLB 42 on lines 45a–45p, respectively. This provides an advantage since a relatively small opcode is used to generate enough individual selection codes to control multiple multiplexors.

In an implementation of system 10a, the combined bit pattern 44 is divided and distributed to different physical portions of an integrated circuit, or, to different circuit boards. For example, the thirty-two (32) bits of output bus 44 is divided into two (2) sixteen-bit groups, D(0–15) and D(16–31)., respectively, that are each distributed to different circuit boards or integrated circuits. This may be the case where the amount of logic required to control thirty-two (32) bits of test pattern exceeds the circuit capacity of a single integrated circuit or circuit board.

Memory 60 and/or RAM 75 need not necessarily be used for all of the separate pattern specific logic blocks in testing system 10 or 10a. Rather, either memory 60 or RAM 75 could serve any combination of two or more separate pattern-specific logic blocks, while still other logic blocks could have dedicated memories and/or share a separate unified memory address space.

Memory 60 and/or RAM 75 may be implemented using 'PC-standard' memory, i.e., a memory that is configured to operate according to PC-standard communication protocol. In general, any physical or electrical memory configuration may be used that is capable of being accessed as a single unified memory address space.

In an embodiment of system 10, link tables associated with a particular data set 60a–60n may be stored in memory 60 and/or RAM 75 along with a data set. Link tables include pointers to different segments of a data set and allow a data set to be stored and then read from a memory in a non-linear fashion. Therefore, a particular PCL 37a–37c may request and store link tables in their associated FIFO registers 38a–38c, the stored link tables may be used to access segments of a data set stored in memory 60 and/or RAM 75 and organized based on those link tables.

The process (or method) of testing an integrated circuit in the described embodiments is not limited to use with the hardware and software of FIGS. 1–2. The process, hereafter referred to as process 200, may find applicability in any computing or processing environment. Process 200 may be implemented in hardware, software, or a combination of the two. Process 200 may be implemented in computer programs executing on programmable computers or other machines that each include a processor and a storage medium readable by the processor.

Other embodiments not described herein are also within the scope of the following claims.

What is claimed is:

1. An apparatus for testing an integrated circuit, the apparatus comprising:
a sequence control logic unit having an output channel connectable to an input pin of a device under test;

a first memory to store a first instruction set comprising instructions executable by the sequence control logic unit, wherein the first memory has a first width and instructions stored in the first memory have a first length; and a second memory to store a second instruction set comprising instructions executable by the sequence control logic unit, wherein the second memory has a second width and instructions stored in the second memory have a second length, the second width not being equal to the first width and the second length not being equal to the first length, and wherein at least one of the first memory and the second memory comprises a memory accessible in a non-sequential fashion.

2. The apparatus of claim 1, wherein at least one of the first memory and the second memory comprises a memory to store a data set, the data set being used by the sequence control logic unit to determine a test pattern to output on the output channel.

3. The apparatus of claim 2, wherein the sequence control logic unit father comprises:
a memory interface having a read/write queue coupled to receive memory access requests from at least two separate requestors.

4. The apparatus of claim 3, wherein the sequence control logic unit further comprises an instruction cache coupled to receive and to hold executable instructions from the memory interface.

5. The apparatus of claim 2, wherein at least one of the first memory and the second memory comprises a memory to store test results received from the device under test.

6. The apparatus of claim 2, further comprising a front end processor coupled to load at least one of the first instruction set, the second instruction set, and the data set to the memory interface.

7. The apparatus of claim 2, wherein the sequence control logic unit further comprises:
a plurality of pattern control logic blocks, at least one of the pattern control logic blocks comprising logic to output a test pattern based on data received from the data set.

8. The apparatus of claim 7, further comprising a plurality of selection multiplexors to receive at least one output bit from a corresponding one of the plurality of pattern control logic blocks; and
a data selection logic block to control an output of each of the plurality of selection multiplexors.

9. The apparatus of claim 8, wherein the data selection logic block determines the data selection codes for each of the plurality of selection multiplexors based on a portion of an executable instruction stored in a one of the first memory and the second memory.

10. The apparatus of claim 2, wherein the data set stored in the first memory and the second memory comprises at least one of a data set representing functional data, scan data, and digitized analog data.

11. The apparatus of claim 1, wherein, during operation of the apparatus, an instruction from the second instruction set is executed responsive to the execution of an instruction from the first instruction set.

12. A method of testing an integrated circuit comprising:
storing a first instruction set in a first memory, the first instruction set usable by a sequence control logic unit and including instructions having a first length
storing a second instruction set in a second memory, the second instruction set usable by the sequence control logic unit and including instructions having a second length that is not equal to the first length; and
accessing the instructions stored in both the first memory and the second memory to determine a test pattern to output on an output channel connectable to input pins of a device under test.

13. The method of claim 12, wherein accessing comprises accessing instructions stored in at least one of the first memory and the second memory in a non-sequential fashion.

14. The method of claim 12, further comprises:
executing a first instruction from the first instruction set of instructions stored in the first memory; and
subsequent to executing the first instruction, executing a second instruction from the second set of instructions stored in the second memory.

15. A testing system comprising:
a processor operable to execute a data selection instruction, the testing system selecting, responsive to the execution of the data selection instruction, a combined output pattern from a plurality of pattern control logic blocks;
a first memory coupled to the processor and operable to store instructions having a first length; and
a second memory coupled to the processor and operable to store instructions having a second length that is not equal to the first length, the second memory not being able to store the instructions having the first length.

16. The testing system of claim 15, wherein the data selection instruction includes:
an opcode field; and
an operand field, the operand field to specify the combined output pattern.

17. The testing system of claim 16, wherein the operand field is used to determine an index for a data lookup table and control the selection of the combined output pattern from the plurality of pattern control blocks.

18. A method of providing instructions to a testing system, the method comprising:
receiving a test sequence program that includes instructions from a unified instruction set;
assembling the test sequence program, wherein assembling includes determining a first executable instruction to be included in a first set of instructions and determining a second executable instruction to be included in a second set of instructions, a length of the first executable instruction being different from a length of the second executable instruction;
storing the first executable instruction in a first memory of a testing system, the first memory having a width that corresponds to the length of the first executable instruction; and
storing the second executable instruction in a second memory of the testing system, the second memory having a width that corresponds to the length of the second executable instruction.

19. The method of claim 18, wherein determining the first executable instruction includes determining that the first executable instruction will be executed in a sequential fashion by the testing system, determining the second executable instruction includes determining that the second executable instruction will be executed in a non-sequential fashion by the testing system, and the second memory is accessible in a non-sequential fashion.

20. A testing system comprising:
a processor operable to execute a call instruction read from a first memory, the testing system reading, responsive to the call instruction, a subsequent instruction from a second memory, the first memory operable to store instructions having a first length and the second memory operable to store instructions having a second length that is not equal to the first length, the second memory not being able to store the instructions having the first length.

* * * * *

UNITED STATES PATENT AND TRADEMARK OFFICE
CERTIFICATE OF CORRECTION

PATENT NO. : 7,039,841 B2  Page 1 of 1
APPLICATION NO. : 10/435613
DATED : May 2, 2006
INVENTOR(S) : Jamie S. Cullen and Kris Sakaitani It is certified that error appears in the above-identified patent and that said Letters Patent is hereby corrected as shown below:

Column 11, line 21, delete "father" and replace with --further--.

Signed and Sealed this

Twenty-ninth Day of August, 2006

JON W. DUDAS
*Director of the United States Patent and Trademark Office*